United States Patent [19]
Wood et al.

[11] Patent Number: 5,578,934
[45] Date of Patent: Nov. 26, 1996

[54] METHOD AND APPARATUS FOR TESTING UNPACKAGED SEMICONDUCTOR DICE

[75] Inventors: Alan G. Wood, Boise; Warren M. Farnworth, Nampa; Salman Akram; David R. Hembree, both of Boise, all of Id.

[73] Assignee: Micron Technology, Inc., Boise, Id.

[21] Appl. No.: 432,111

[22] Filed: May 1, 1995

Related U.S. Application Data

[63] Continuation-in-part of Ser. No. 345,064, Nov. 14, 1994, Pat. No. 5,541,525, which is a continuation-in-part of Ser. No. 124,899, Sep. 21, 1993, Pat. No. 5,495,179, which is a continuation-in-part of Ser. No. 46,675, Apr. 14, 1993, Pat. No. 5,367,253, which is a continuation-in-part of Ser. No. 973,931, Nov. 10, 1992, Pat. No. 5,302,891, which is a continuation of Ser. No. 709,858, Jun. 4, 1991, abandoned.

[51] Int. Cl.$^6$ .................................................. G01R 31/02
[52] U.S. Cl. ......................... 324/758; 324/755; 324/760
[58] Field of Search .............................. 324/158.1, 755, 324/754, 760, 501, 765, 73.1, 758

[56] References Cited

U.S. PATENT DOCUMENTS

| | | | |
|---|---|---|---|
| 4,145,620 | 3/1979 | Dice | 324/501 |
| 4,585,991 | 4/1986 | Reid et al. | 324/158 P |
| 4,899,107 | 2/1990 | Corbett et al. | 324/158 F |
| 4,937,653 | 6/1990 | Blonder et al. | 357/68 |
| 4,952,272 | 8/1990 | Okino et al. | 156/630 |
| 5,072,289 | 12/1991 | Sugimoto et al. | 357/68 |
| 5,073,117 | 12/1991 | Malhi et al. | 439/71 |
| 5,088,190 | 2/1992 | Malhi et al. | 29/843 |
| 5,090,118 | 2/1992 | Kwon et al. | 29/843 |
| 5,123,850 | 6/1992 | Elder et al. | 439/67 |
| 5,177,439 | 1/1993 | Liu et al. | 324/158 P |
| 5,225,037 | 7/1993 | Elder et al. | 156/644 |
| 5,302,891 | 4/1994 | Wood et al. | 324/158 F |
| 5,326,428 | 7/1994 | Farnworth et al. | 156/654 |
| 5,367,253 | 11/1994 | Wood et al. | 324/158.1 |
| 5,408,190 | 4/1995 | Wood et al. | 324/765 |
| 5,440,240 | 8/1995 | Wood et al. | 324/765 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,519,332 | 5/1996 | Wood et al. | 325/755 |

FOREIGN PATENT DOCUMENTS

| | | | |
|---|---|---|---|
| 1-205301 | 8/1989 | Japan | H01L 21/66 |

OTHER PUBLICATIONS

Miyake, Kiyoshi et al., "Connectivity Analysis of New 'Known Good Die' Connection System Using Microbumps", Nitto Denko Corporation, Japan, Technical Paper, Mar. 22, 1993.

Yashhijo, Yamamoto, et al., "Evaluation of New Micro Connection System Using Microbumps", ISHM '93 Proceedings, Nov. 9–11, 1993, Japan, pp. 370–378.

Cloud et al., "Equipment, Processes and Methods For High Volume KGD Production", Semicon West 1994, Mountview, CA., Third Annual Manufacturing, Jul. 2, 1994, text pages 150, 170.

*Primary Examiner*—Ernest F. Karlsen
*Attorney, Agent, or Firm*—Stephen A. Gratton

[57] ABSTRACT

A method and apparatus for testing unpackaged semiconductor dice includes a mother board and a plurality of interconnects mounted on the mother board and adapted to establish a temporary electrical connection with the dice. The interconnects can be formed with a silicon substrate and raised contact members for contacting the bond pads of a die. Alternately the interconnects can be formed with micro bump contact members mounted on an insulating film. The mother board allows each die to be tested separately for speed and functionality and to also be burn-in tested in parallel using standard burn-in ovens. In an alternate embodiment testing is performed using a mother board/daughter board arrangement. Each daughter board includes interconnects that allow the dice to be tested individually for speed and functionality. Multipule daughter boards can then be mounted to the mother board for burn-in testing using standard burn-in ovens.

24 Claims, 4 Drawing Sheets

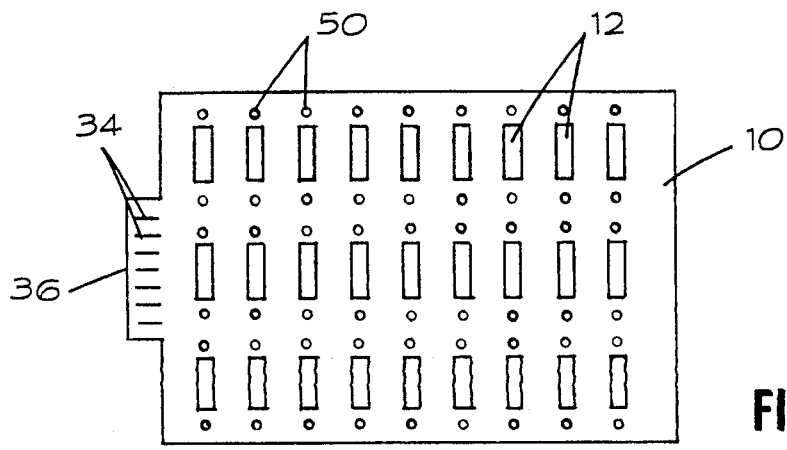
FIGURE 1
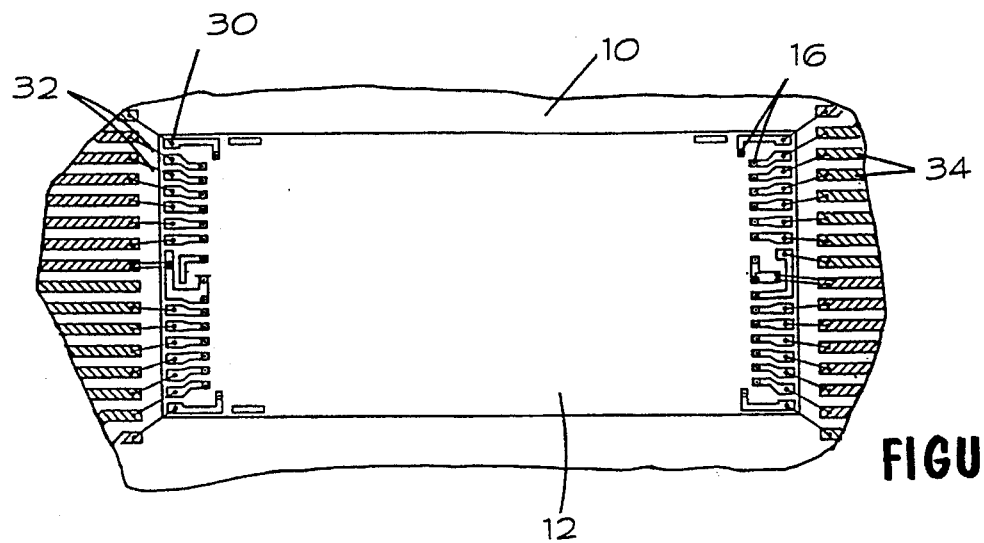
FIGURE 2
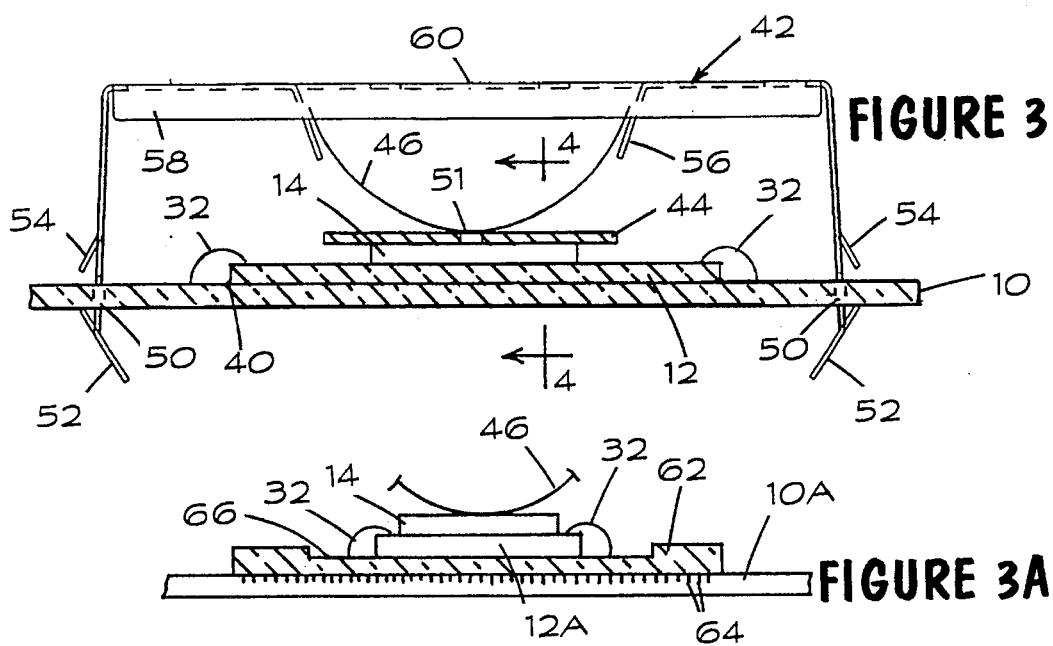
FIGURE 3
FIGURE 3A

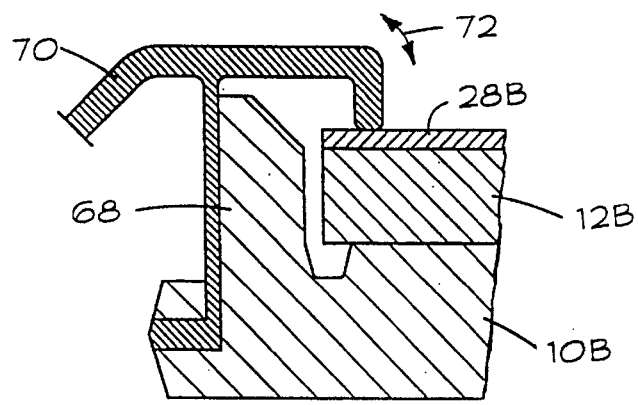
FIGURE 5
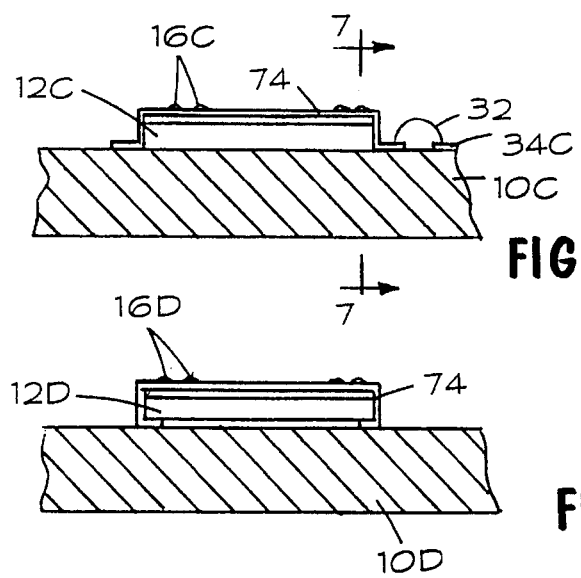
FIGURE 6
FIGURE 6A
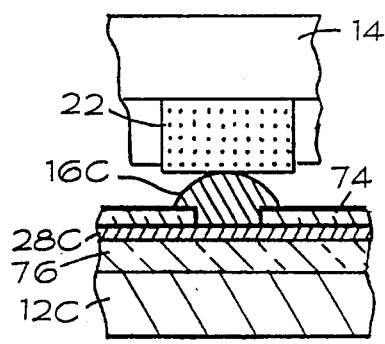
FIGURE 7

METHOD AND APPARATUS FOR TESTING UNPACKAGED SEMICONDUCTOR DICE

CROSS REFERENCE TO RELATED APPLICATIONS

This application is a continuation-in-part of application Ser. No. 08/345,064 filed Nov. 14, 1994, now U.S. Pat. No. 5,541,525, which is a continuation-in-part of application Ser. No. 08/124,899 filed Sep. 21, 1993, now U.S. Pat. No. 5,495,179, which is a continuation-in-part of application Ser. No. 08/046,675, filed Apr. 14, 1993, Pat. No. 5,367,253, which is a continuation-in-part of application Ser. No. 07/973,931 filed on Nov. 10, 1992, Pat. No. 5,302,891, which is a continuation of application Ser. No. 07/709,858, filed Jun. 4, 1991, abandoned.

This application is related to copending applications Ser. No. 07/788,065 filed Nov. 5, 1991, now U.S. Pat. No. 5,440,240; 07/953,750 filed Sept. 29, 1992, now abandoned; 08/073,005 filed Jun. 7, 1993, now U.S. Pat. No. 5,408,190; 08/073,003 filed Jun. 7, 1993, now abandoned; 08/120,628 filed Sept. 13, 1993, now abandoned; 07/896,297 filed Jun. 10, 1992, now U.S. Pat. No. 5,424,652; 08/192,391 filed Feb. 3, 1994, now U.S. Pat. No. 5,483,174; 08/137,675 filed Oct. 14, 1993, now abandoned; and 08/387,687 filed Feb. 13, 1995, pending; all of which are incorporated herein by reference.

FIELD OF THE INVENTION

This invention relates to semiconductor manufacture and more particularly to an improved method and apparatus for testing unpackaged semiconductor dice.

BACKGROUND OF THE INVENTION

Microelectronic packages called "multi chip modules" or "hybrids" are assembled using unpackaged semiconductor dice. Prior to the assembly procedure, each unpackaged die must be tested to measure its quality and reliability. This has led to the development of test procedures suitable for testing unpackaged semiconductor dice. Known-good-die (KGD) refers to an unpackaged die having the same quality and reliability as the equivalent packaged die.

Testing includes burn-in testing wherein the dice are heated while the integrated circuits are electrically biased. In addition, the dice are subject to speed and functionality tests to check the performance of the integrated circuits and devices formed on the dice. Among the parameters tested are input and output voltages, capacitance and current specifications. Memory chips are also put through logic tests wherein data storage, retrieval capabilities and response times are measured.

For testing and burning-in unpackaged dice, temporary carriers have been used in the manufacturing process in place of conventional single chip packages. This type of carrier typically includes a base for retaining and housing a single die. The carrier also includes an interconnect that allows a temporary electrical connection to be made between an individual die and external test circuitry. Carriers for testing unpackaged dice are disclosed in U.S. Pat. No. 4,899,107 to Corbett et al. and U.S. Pat. No. 5,302,891 to Wood et al., which are commonly assigned with the present application.

This type of carrier allows tests to be performed on an unpackaged die without damaging the die. The bond pads of a die are particularly susceptible to damage during the testing procedures. Although these types of carriers are suitable for testing a singulated unpackaged die, it would be advantageous to be able to test multiple dice at the same time. This would simplify the handling and test procedures and allow testing to proceed without a separate carrier for each die. In addition, it would be advantageous to perform both burn-in, speed and functionality testing using a common test fixture.

In view of the foregoing, it is an object of the present invention to provide an improved method and apparatus for test and burn-in of unpackaged dice.

It is a further object of the present invention to provide an improved method and apparatus for testing unpackaged dice that permits multiple dice to be tested at the same time.

It is a further object of the invention to provide an improved method and apparatus for testing unpackaged dice that are simple, inexpensive and compatible with volume manufacturing processes and equipment.

It is yet another object of the present invention to provide a method and apparatus for performing speed and functionality testing as well as burn-in testing of multiple dice with a single test fixture.

Other objects, advantages, and capabilities of the present invention will become more apparent as the description proceeds.

SUMMARY OF THE INVENTION

In accordance with the present invention, an improved method and apparatus for testing unpackaged semiconductor dice are provided. The method, generally stated, includes: forming a mother board with a plurality of interconnects; assembling multiple dice with the interconnects to establish temporary electrical connections for testing; and then testing the dice by applying signals through the mother board and interconnects to the dice. The mother board can be used for speed and functionality testing the dice individually and also as a burn-in board for burn-in testing the dice using standard burn-in ovens.

The mother board includes a separate interconnect for each die. A large number of interconnects are attached to the mother board in electrical communication with conductive traces and with an external electrical connector for the entire mother board. The conductive traces on the mother board form circuit paths to each interconnect to allow the dice assembled with the interconnects to be tested. In addition, the conductive traces can be electrically connected to conducting strips that connect multiple dice in parallel to allow burn-in testing using standard burn-in ovens. A force distribution mechanism is associated with each interconnect for securing the dice to the interconnects and biasing these two components together.

In an alternate embodiment multiple dice are attached to daughter boards mountable to the mother board. Each die is retained on a daughter board in contact with an interconnect formed on the daughter board. The mother board and daughter board include means for establishing an electrical connection therebetween, and means for securing the daughter boards to the mother board. With this arrangement, the daughter boards can be used for testing the speed and functionality of the dice. Each die on the daughter board can be electrically isolated for speed and functionality. The daughter boards can then be mounted on the mother board for burn-in testing using a standard burn-in oven.

In either embodiment, the interconnects are formed with a substrate, such as silicon or ceramic, sized for mating engagement with a die. The substrates include raised contact members for establishing a temporary electrical connection to the bond pads on the die. The raised contact members can be etched into a substrate formed of a silicon and then overlaid with a conductive layer patterned to form conductive traces. Alternately the raised contact members can be formed as microbump contact members on an insulating film patterned with metallic conductive traces. Such a microbump interconnect can be electrically attached to the mother board using techniques similar to those used in tape automated bonding (TAB).

The method of the invention broadly stated includes the steps of: forming a mother board; forming conductive traces on the mother board in electrical communication with an external connector; forming an interconnect having raised contact members for contacting contact locations on a semiconductor die; assembling multiple interconnects on the mother board with the raised contact members on the interconnect in electrical communication with the conductive traces on the mother board; forming a force distribution mechanism for biasing each die to an interconnect; assembling the dice, interconnects and force distribution mechanisms together with the raised contact members on the interconnects in electrical communication with the contact locations on the dice; and testing the dice using the mother board.

BRIEF DESCRIPTION OF THE DRAWINGS

FIG. 1 is a schematic plan view of a mother board constructed in accordance with the invention;

FIG. 2 is an enlarged plan view of a portion of FIG. 1 showing an interconnect wire bonded to conductive traces formed on the mother board;

FIG. 3 is a cross sectional view showing the mother board and an interconnect along with a force distribution mechanism for securing a die to the interconnect for testing;

FIG. 3A is a cross sectional view, with parts removed, showing an alternate embodiment mother board wherein the interconnect is mounted on a base that plugs into the mother board;

FIG. 5 is a partial cross sectional view of an alternate embodiment mother board formed with sockets and electrical clips for mounting the interconnects to the mother board;

FIGS. 6 and 6A are cross sectional views of an alternate embodiment interconnect formed with microbump contact members;

FIG. 7 is a cross sectional view equivalent to FIG. 4 showing a microbump contact member electrically engaging a bond pad on a semiconductor die;

DETAILED DESCRIPTION OF THE PREFERRED EMBODIMENT

Referring to FIG. 1, a mother board 10 suitable for practicing the method of the invention is shown. The mother board 10 is formed of an electrically insulating material similar to those used to form printed circuit boards. Suitable materials for the mother board 10 include high temperature glass filled plastics, ceramics and polyimides.

A large number of interconnects 12 are mounted to the mother board 10. Each interconnect 12 is adapted to establish an electrical connection with a semiconductor die 14 (FIG. 3). The interconnects 12 can be formed as described in related copending application 08/387,687 filed Feb. 13, 1995, pending and entitled "Method For Forming An Interconnect Having A Penetration Limited Contact Structure For Establishing A Temporary Electrical Connection With A Semiconductor Die" which is incorporated herein by reference.

Figure 4:
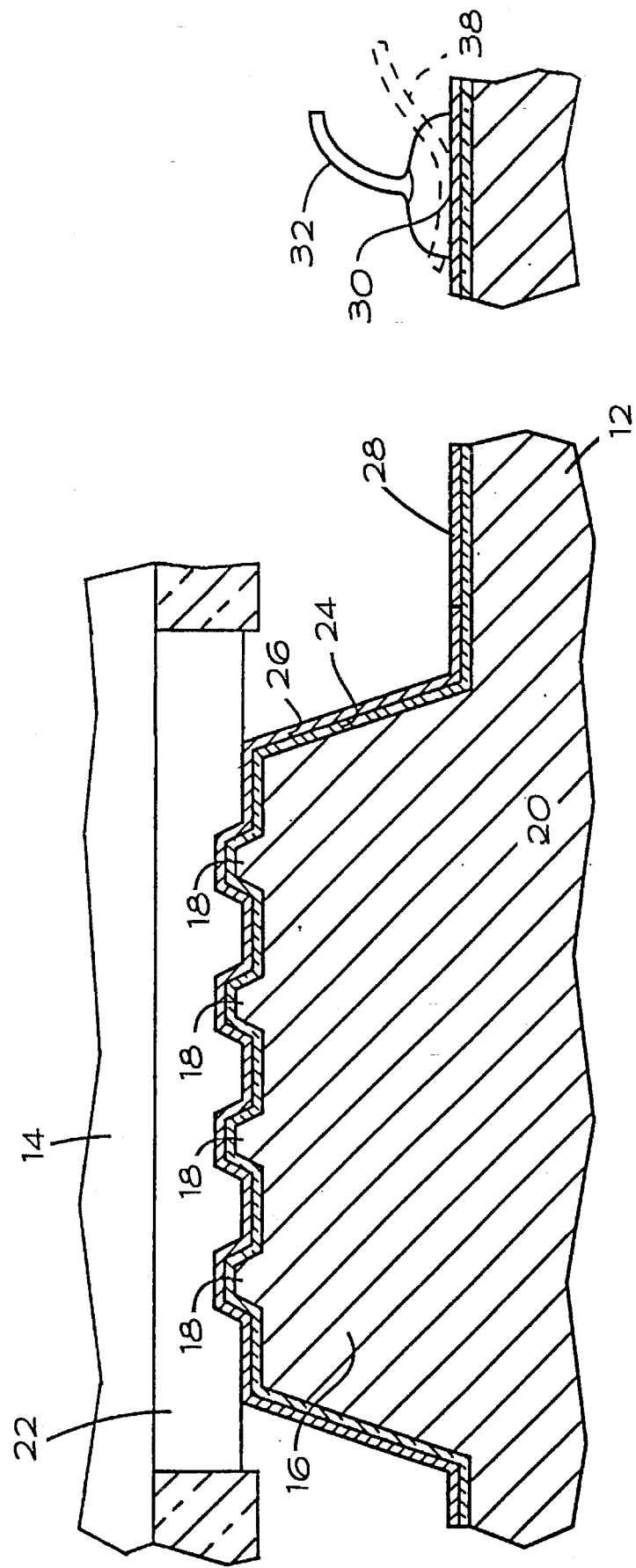
FIG. 4 is a cross sectional view taken along section line 4—4 of FIG. 3 showing a raised contact member of an interconnect electrically engaging a bond pad of a semiconductor die.

As shown in FIG. 4, this type of interconnect 12 includes a substrate 20 formed of a material such as silicon or ceramic. These materials have a coefficient of thermal expansion (CTE) that closely matches the CTE for a semiconductor die 14. The interconnect 14 includes raised contact members 16 formed integrally with the substrate 20 using an etching process as described in the above cited patent application. The raised contact members 16 are formed with a size and spacing that matches the size and spacing of the bond pads 22 on the die 14. In addition, the raised contact members 16 are formed with projections 18 adapted to penetrate into the bond pads 22 but with a self limiting penetration depth. The projections 18 pierce any native oxide covering the bond pad 22 to establish an ohmic contact.

An insulating layer 24, such as $SiO_2$, is formed on the substrate 20 of the interconnect 12 including over the raised contact members 16. A conductive layer 26, formed of a highly conductive metal, is formed on the insulating layer 24 over the raised contact members 16. The conductive layer 26 is placed in electrical communication with conductive traces 28 formed on the surface of the substrate 20. As shown in FIG. 2, the conductive traces 28 extend to the edges of the interconnect 12 and are formed with bond sites 30. A bond wire 32 is wire bonded to the bond sites 30 to establish an electrical path to the mother board 10. By way of example the conductive layer 26 and conductive traces 28 for the interconnects 12 can be formed by depositing and patterning a highly conductive metal such as aluminum or copper.

The bond wires 32 are wire bonded at the opposite end to conductive traces 34 (FIG. 2) formed on the mother board 10. The mother board 10 includes a pattern of conductive traces 34 to each interconnect 12 attached to the mother board 10. The conductive traces 34 on the interconnect 12 terminate at an external connector 36 (FIG. 1) formed on the mother board 12. The external connector 36 is formed as a male or female member adapted for mating engagement with a corresponding male or female member (e.g., plug/socket).

This arrangement establishes an electrical path from the bond pads 22 on the die 14, through the raised contact members 16 on the interconnect 12, through the conductive traces 26 on the interconnect 12, through the bond wires 32, through the conductive traces 34 on the mother board 10 and to external test circuitry. Alternately, in place of wire bonding this electrical path can be established using a mechanical connection 38 (FIG. 4) such as spring clips.

The bond wires 32 not only establish an electrical connection between the interconnects 12 and mother board 10 but also help to secure the interconnects 12 to the mother board 10. An adhesive 40 can also be used to secure the interconnects 12 to the mother board 10.

Referring now to FIG. 3, the die 14 is shown secured to the interconnect 12 during a test procedure. A force distribution mechanism 42 is associated with each interconnect 12 for biasing the die 14 and the interconnect 12 together. The force distribution mechanism 42 removably attaches to a pair of openings 50 formed on the mother board 10. The force distribution mechanism 42 includes a pressure plate 44, a spring 46 and a bridge clamp 48 for biasing the die 14 against the interconnect 12 with an evenly distributed biasing force.

The pressure plate 44 functions to evenly distribute the load applied by the spring 46. In addition, the pressure plate 44 functions to dissipate heat from the die 14 during the test procedures. However, a force distribution mechanism can also be constructed to function without a pressure plate 44.

The spring 46 of the force distribution mechanism 42 is formed of an elastically resilient material such as spring steel. The spring 46 is sized and shaped to exert a predetermined spring force on the pressure plate 44. This force is evenly distributed by the pressure plate 44 over the back surface of the die 14 and biases the die 14 against the interconnect 12. The spring 46 and pressure plate 44 are formed with openings 51 that permit access for an assembly tool.

Still referring to FIG. 3, the bridge clamp 48 is a flexible structure formed of a resilient material such as steel. The bridge clamp 48 includes mounting tabs 51. During the assembly procedure the mounting tabs 52 are placed through the openings 50 in the mother board 10. The structure of the mounting tabs 52 and the bridge clamp 48 under tensioning from the spring 46 cooperate to secure the bridge clamp 48 to the mother board 10. Another set of tabs 54 can be formed on the bridge clamp 48 to limit the downward movement of the bridge clamp 48. This arrangement functions to secure the die 14 to the mother board 10 and to bias the die 14 and interconnect 12 together with a predetermined force.

The bridge clamp 48 also includes downwardly extending tabs 56 for attaching the spring 46 to the bridge clamp 48 by physical contact or a fastening mechanism such as spot welds. The longitudinal upper edges of the bridge clamp 48 are bent at a 90° angle to form stiffener members 58 on either side. In addition, a central opening 60 is formed in the bridge clamp 48 as an access opening for an assembly tool.

During the assembly procedure the raised contact members 16 (FIG. 4) on the interconnect 12 are aligned with the bond pads 22 on the die 14 using an aligner bonder tool. At the same time an assembly tool is used to secure the bridge clamp 48 to the mother board 10. An aligner bonder tool is described in copending U.S. patent application Ser. No. 08/338,345 filed Nov. 14, 1994, pending entitled "Method And Apparatus For Manufacturing Known Good Semiconductor Die", incorporated herein by reference.

Referring now to FIG. 3A, an alternate embodiment mother board 10A is shown. In the alternate embodiment mother board 10A, the interconnect 12A is mounted in a base 62 secured to the mother board 10A. The interconnect 12A is secured to a recess 66 formed in the base 62 using an adhesive. The base 62 includes electrical pins 64 that fit into corresponding holes in the mother board 10A. The base 62 is formed such that the pins 64 are in electrical communication with the bond wires 32 from the interconnect 12A.

In addition, the mother board 10A is formed such that the plugged in pins 64 are in electrical communication with the conductive traces 34 formed on the mother board 10A. This type of base 62 can be formed as described in copending U.S. application Ser. No. 08/398,309, filed Mar. 1, 1995, now U.S. Pat. No. 5,519,332, entitled "Carrier For Testing An Unpackaged Semiconductor Die", incorporated herein by reference. The alternate embodiment mother board 10A functions substantially the same as the mother board 10 previously described. The base 42 permits the force distribution mechanism 42 to be secured to the base 62 rather than to the mother board 10A.

With reference to FIG. 5, another alternate embodiment mother board 10B is shown. The mother board 10B includes a socket 68 formed integrally with the mother board 10B for retaining and mounting the interconnects 12B. Each socket 68 has a peripheral configuration that matches but is slightly larger than the peripheral configuration of the interconnects 12B. Each socket 68 includes a plurality of electrical clips 70 for securing the interconnects 12B and establishing an electrical connection with the conductive traces 28B on the interconnects 12B. Each conductive trace 28B formed on the interconnects 12B will have an associated electrical clip 70. The electrical clips 70 are in electrical communication with an external connector (not shown) equivalent to the external connector 36 (FIG. 1) for the mother board 10 previously described.

The electrical clips 70 provides an alternative for the wire bonding arrangement previously described and shown in FIG. 2 for mother board 10. The electrical clips 70 are formed of a conductive elastic material, such as metal. The electrical clips 70 in addition to establishing an electrical path also function to clamp the interconnects 12B to the mother board 10B. The electrical clips 70 are adapted to pivot as indicated by directional arrow 72 for releasing the interconnects 12B. The electrical clips 70 can be formed integrally with the mother board 10B using injection molding. Alternately a lamination process can be used. Previously cited copending application Ser. No. 08/398,309, filed Mar. 1, 1995, now U.S. Pat. No. 5,5519,332, discloses suitable injection molding and lamination processes for forming the electrical clips 70 and the mother board 10B. The mother board 10B is adapted for use with a force distribution mechanism 42 (FIG. 3) as previously described.

Referring now to FIGS. 6, 6A and 7, another alternate embodiment mother board 10C is shown. In the alternate embodiment, mother board 10C microbump contact members 16C are formed on an interconnect 12C. Microbump contact technology is used for tape automated bonding (TAB). Microbump contacts are commercially available from Nitto Denko America, Inc. and are sold under the trademark ASMAT™. Microbump contacts are also commercially available from Packard-Hughes Interconnect, Irvine, Calif. and are sold under the trademark Gold Dot™. U.S. Pat. No. 5,072,289 to Sugimoto et al. describes a method for forming microbump contact members. Rather than being used to provide a permanent connection, the microbump contact members 16C are used in the present case as shown in FIG. 7, to establish a non-bonded temporary electrical connection to the die 14.

The microbump interconnects 12C include an insulating substrate formed of a rigid material such as silicon or ceramic. A nonconductive and electrically insulating film 74 (e.g., polyimide) is attached to the interconnect 12C using an adhesive 76 (FIG. 7). The insulating film 74 has a metallic foil (e.g., Cu) attached thereto. The foil is patterned and etched to form conductive traces 28C. Holes are etched through the insulating film 74 in contact with the conductive traces 28C. The microbump contact members 16C are formed as metal bumps (e.g., Ni, Au, solder, Cu) in contact with the conductive traces 28C.

The conductive traces 28C on the microbump interconnect 12C are equivalent to the conductive traces 28 previously described for the interconnect 12 (FIG. 2). In the embodiment illustrated in FIG. 6, the conductive traces 28C take the place of a portion of the conductive traces 34 (FIG. 2) on the mother board 10 previously described. Bond wires 32 as previously described, or tape automated bonding can be used to bond the conductive traces 28C (FIG. 7) on the microbump interconnect 12C to the conductive traces 34 on the mother board 10C. Tape automated bonding can be fusible contacts that can be soldered or otherwise bonded to mating connection points using heat, pressure or ultrasonic energy. Conductive adhesive such as z-axis anisotropic adhesives can also be used to provide an electrical connection.

During use of the mother board 10C, a force distribution mechanism can be used as previously described, to bias the microbump contact members 16C against the bond pads 22 on the die 14. The adhesive 76 functions as a compressible member to provide compliancy and accommodate height variations between the bond pads 22 and microbump contact members 16C.

FIG. 6A shows an embodiment wherein the insulating film 74 wraps around the interconnect 12D and establishes an electrical connection between the interconnect 12D and mother board 10D using tape automated bonding or a conductive adhesive. In this embodiment the mother board 10D includes conductive traces (not shown) similar to the conductive traces 34 (FIG. 2) previously described for mother board 10. Heat and pressure can be used to fuse microbump contact members formed on the insulating film 72 to conductive traces formed on the mother board 10D. Conductive adhesives such as z-axis anisotropic adhesives can also be used to form an electrical path between the conductive traces on the mother board 10D and the microbump contact members 16C. The function of the mother board 10D is otherwise the same as the mother board 10C.

Figure 8:
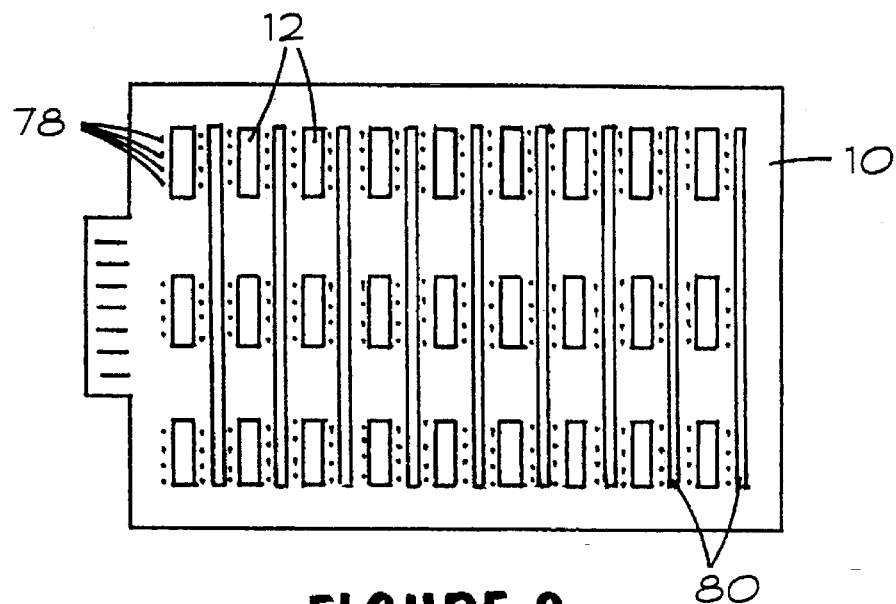
FIG. 8 is a schematic plan view of a mother board showing conducting strips for electrically connecting multiple interconnects in parallel for burn-in testing using standard burn-in ovens.

Referring now to FIG. 8, another aspect of the mother board 10 (FIG. 1) originally described is illustrated. During the manufacture of Known Good Die (KGD), it is necessary to test each die to certify functionality and reliability. Full functionality and reliability testing includes both burn-in and speed testing. A problem occurs because the equipment used for burn-in testing is not suitable for speed and functionality testing. As an example, burn-in ovens manufactured by Micron Systems Integration under the trademark AMBYX include burn-in boards for testing a large number of packaged dice at once. The leads on the packaged dice are connected or plugged into corresponding electrical connectors on the burn-in board. The burn-in boards include a power grid to establish a temporary electrical connection to multiple dice at one time (e.g., 64). The burn-in ovens thus use "shared resources" to test a large number of dice. However, the same resources cannot be used for speed and functionality testing because of the time variables introduced by interconnecting multiple dice.

The mother board 10 constructed in accordance with the invention can be used for speed and functionality testing and also for burn-in testing. The mother board 10 can include the interconnects 12 formed as previously described. In addition, the mother board 10 includes connection pads 78 represented by the dots around each interconnect 12. The connection pads 78 permit each die to be accessed separately for speed and functionality testing using separate pogo pin connectors. Pogo pin connectors are manufactured by Pogo Instruments, Inc. Kansas City, Kans.

For burn-in testing removable conducting strips 80 are attached to the mother board 10 for interconnecting all of the interconnects 12 on the mother board 10 in parallel. Such a parallel connection arrangement can be used for burn-in testing the dice using a shared resources burn-in oven. The same mother board 10 can thus be utilized for both full functionality testing and burn-in testing.

Figure 9:
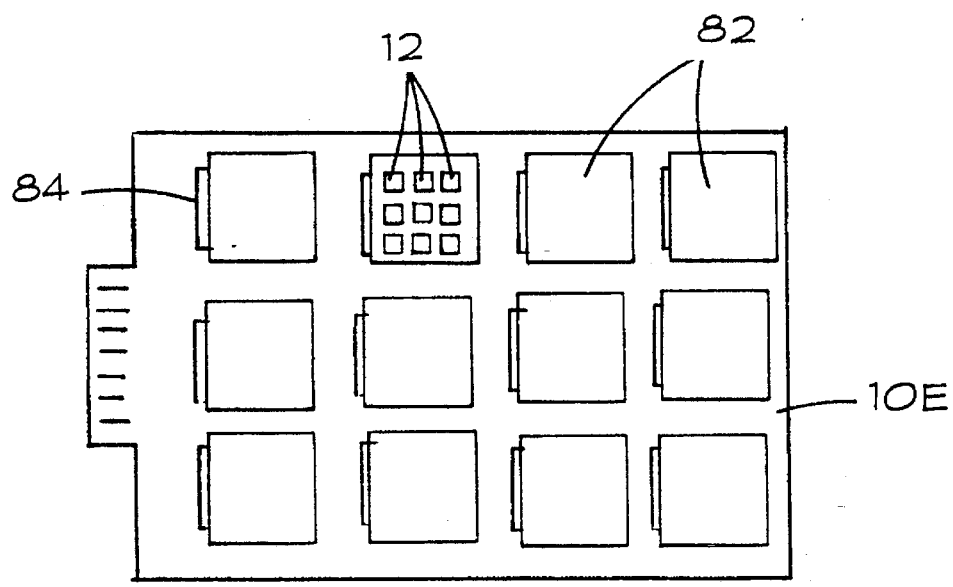
FIG. 9 is a schematic plan view of an alternate embodiment mother board adapted for use with daughter boards for testing multiple semiconductor dice.

Referring now to FIG. 9, another alternate embodiment mother board 10E is shown. The mother board 10E is adapted for mounting multiple daughter boards 82. Each daughter board 82 includes multiple interconnects 12 mounted as previously described using wire bonding, electrical clips or microbump contacts. In this embodiment the daughter boards 82 can be formed substantially the same as the mother board 10 previously described. The daughter boards 82 each include an electrical connector 84 that plugs into a mating connector on the mother board 10E. This establishes an electrical connection between the daughter boards 82 and mother board 10E.

Using the mother board 10E/daughter board 82 arrangement, multiple dice can be loaded onto a daughter board 82 and tested for full functionality. Multiple daughter boards can then be loaded onto the mother board 10E for burn-in testing using standard burn-in equipment.

While the invention has been described with reference to certain preferred embodiments, as will be apparent to those skilled in the art, certain changes and modifications can be made without departing from the scope of the invention as defined by the following claims.

What is claimed is:

1. A method for testing an unpackaged semiconductor die comprising:

providing a mother board with an electrical connector;

providing a plurality of interconnects mounted on the mother boards each interconnect configured to establish electrical communication with the die and having a contact member in electrical communication with the electrical connector, said contact member configured for contacting a contact location on the die;

optically aligning the contact location on the die with the contact member on a selected interconnect and placing the contact location on the die in contact with the contact member on the selected interconnect;

biasing the die and the selected interconnect together with the contact member on the selected interconnect in electrical communication with the contact location on the die; and testing the die by applying test signals through the electrical connector and selected interconnect to the die.

2. The method as claimed in claim 1 and wherein the testing includes functionality testing each die is electrically isolated on the mother board for and burn-in testing.

3. The method as claimed in claim 1 and wherein the contact members on the interconnects are formed on a substrate and are covered with a conductive material.

4. The method as claimed in claim 1 and wherein each interconnect comprises a substrate, an insulating film attached to the substrate and metal microbumps attached to the insulating film to form the contact members.

5. The method as claimed in claim 4 and further comprising establishing an electrical path between the microbumps and mother board by forming conductive traces on the insulating film and conductive traces on the mother board and electrically connecting the conductive traces using tape automated bonding.

6. The method as claimed in claim 4 and further comprising establishing an electrical path between the microbumps and mother board by forming conductive traces on the insulating film and conductive traces on the mother board and electrically connecting the conductive traces using a conductive adhesive.

7. The method as claimed in claim 1 and further comprising establishing an electrical path between the interconnects and mother board by wire bonding conductive traces formed on the mother board to conductive traces formed on the interconnects.

8. The method as claimed in claim 1 and wherein the interconnects are retained in bases attached to the mother board.

9. The method as claimed in claim 1 and further comprising:

electrically connecting the interconnects in parallel using conducting strips removably attached to the mother board; and burn-in testing the dice using the mother board as a burn-in board.

10. A method for testing an unpackaged semiconductor die comprising:

providing a mother board with an electrical connector;

mounting a plurality of interconnects on the mother board, each interconnect configured to establish electrical communication with the die and having contact members in electrical communication with the electrical connector for contacting contact locations on the die;

providing a force distribution mechanism for securing and biasing the die on a selected interconnect;

optically aligning the contact locations on the die with the contact members on the selected interconnect;

placing the die and selected interconnect in contact and attaching the force distribution mechanism to the mother board;

testing the by applying test signals through the electrical connector and selected interconnect to the die.

11. The method as claimed in claim 10 and further comprising:

connecting the interconnects in parallel; and burn-in testing the unpackaged dice using the mother board as a burn-in board.

12. The method as claimed in claim 10 and wherein testing includes functionality testing with each die electrically isolated.

13. The method as claimed in claim 10 and wherein electrical communication between the contact members and electrical connector is formed by wire bonding.

14. The method as claimed in claim 10 and wherein electrical communication between the contact members and electrical connector is formed by electrical clips.

15. The method as claimed in claim 10 and wherein the force distribution mechanism includes a clamp attachable to openings in the mother board and a spring for biasing the die and selected interconnect together.

16. The method as claimed in claim 10 and further comprising forming a base for each interconnect and attaching the bases to the mother board.

17. The method as claimed in claim 10 and wherein each interconnect is formed with raised contact member on a substrate.

18. The method as claimed in claim 10 and wherein each interconnect is formed with a substrate, an insulating film attached to the substrate, micro bump contact members formed on the insulating film and conductive traces in electrical communication with the micro bump contact members.

19. The method as claimed in claim 18 and further comprising Wire bonding the conductive traces on the interconnect to the mother board.

20. A method for testing an unpackaged semiconductor die, said method comprising:

providing a mother board having an electrical connector;

mounting a plurality of interconnects on the mother board in electrical communication with the electrical connector, each said interconnect configured to establish a temporary electrical connection to the die;

optically aligning the die and a selected interconnect and placing the die on the mother board in electrical communication with the selected interconnect;

biasing the die and selected interconnect together; and testing the die by applying test signals through the electrical connector and selected interconnect to the die.

21. The method as claimed in claim 20 and wherein the raised contact members include penetrating projections adapted to penetrate contact locations on the die.

22. The method as claimed in claim 21 and wherein biasing the die and selected interconnect is with a force distribution mechanism attached to the mother board.

23. The method as claimed in claim 22 and further comprising:

electrically connecting the interconnects in parallel using conducting strips removably attached to the mother board; and burn-in testing a plurality of dice using the mother board as a burn-in board.

24. The method as claimed in claim 23 and wherein the force distribution mechanism includes a clamp and a spring.

* * * * *